United States Patent [19]
Selvakumar et al.

[11] Patent Number: 5,633,194
[45] Date of Patent: May 27, 1997

[54] LOW TEMPERATURE ION-BEAM ASSISTED DEPOSITION METHODS FOR REALIZING SIGE/SI HETEROSTRUCTURE

[75] Inventors: C. R. Selvakumar; S. Mohajerzadeh; D. E. Brodie, all of Waterloo, Canada

[73] Assignee: The University of Waterloo, Ontario, Canada

[21] Appl. No.: 424,208

[22] Filed: Apr. 19, 1995

[51] Int. Cl.$^6$ ................................................ H01L 21/20
[52] U.S. Cl. ........................... 117/103; 117/108; 117/97
[58] Field of Search ........................... 437/132, 106, 437/131; 117/108, 103

[56] References Cited

U.S. PATENT DOCUMENTS

| | | | |
|---|---|---|---|
| 4,521,447 | 6/1985 | Ovshinsky et al. | 437/131 |
| 5,041,302 | 8/1991 | Koide | 117/108 |
| 5,192,393 | 3/1993 | Muranaka et al. | 117/103 |
| 5,246,886 | 9/1993 | Sakai et al. | 437/131 |

FOREIGN PATENT DOCUMENTS 57-208127  12/1982  Japan ..................... 117/108

OTHER PUBLICATIONS

P.C. Zalm et al., *Ion Beam Epitaxy of Silicon on Ge and Si at Temperatures of 400K*, Appl. Phys. Lett. 41(2), 15 Jul. 1982, at 167.
M.V. Ramana Murty et al., *Very Low Temperature (<400° C.) Silicon Molecular Beam Epitaxy: The Role of Low Energy Ion Irradiation*, Appl. Phys. Lett. 62(20), 17 May 1993, at 2566.
I. Yamada et al., *Crystalline and Electrical Characteristics of Silicon Films Deposited by Ionized–Cluster–Beams*, Japanese Journal of Applied Physics, vol. 19, No. 4, Apr. 1980, at L181.
K.G. Orrman–Rossiter et al., *Ion Beam Deposited Epitaxial Thin Silicon Films*, Nuclear Instruments and Methods in Physics Research B59/60 (1991), at 197.
*Ion Beam Assisted Film Growth*, Beam Modification of Materials, 3, Chap. 5, at 101; (1989).
T. Ohmi et al., *Low–temperature Silicon Epitaxy by Low–Energy Bias Sputtering*, Appl. Phys. Lett. 53(5), 1 Aug. 1988, at 364.
A.H. Al–Bayati et al., *Substrate Temperature Dependence of Homoepotaxial Growth of Si Using Mass Selected Ion Beam Deposition*, J. Appl. Phys. 76(7), 1 Oct. 1994, at 4383.
T.J. Donahue et al., *Silicon Epitaxy at 650°–800° C. Using Low–pressure Chemical Vapor Deposition Both With and Without Plasma Enhancement*, J. Appl. Phys. 57(8), 15 Apr. 1985, at 2757.
W. Kern et al., *Cleaning Solutions Based on Hydrogen Peroxide for Use in Silicon Semiconductor Technology*, RCA Review, Jun. 1970, at 187.
J.P. McCaffrey, *Small–angle Cleavage of Semiconductors for Transmission Electron Microscopy*, Ultramicroscopy 38 (1991), at 149.
C.I. Dorwley et al., *Model for Facet and Sidewall Defects Formation During Selective Epitaxial Growth of (001) Silicon*, Appl. Phys. Lett. 52(7), 15 Feb. 1988, at 546.
K. Hartig et al., *Nucleation and Growth in the System Ag/Mo (100): A Comparison of UHV–SEM and AES/LEED Observations*, Surface Science 74 (1978), at 69.
T. Ohmi et al., *Formation of Device–Grade Epitaxial Silicon Films at Extremely Low Temperatures by Low–energy Bias Sputtering*, J. Appl. Phys. vol. 66, No. 10, 15, Nov. 1989, at 4756.
J.C. Bean et al., *Dependence of Residual Damage on Temperature During Ar+ Sputter Cleaning of Silicon*, Journal of Applied Physics, vol. 48, No. 3, Mar. 1977, at 907.

*Primary Examiner*—R. Bruce Breneman
*Assistant Examiner*—Ramamohan Rao Paladugu
*Attorney, Agent, or Firm*—Fay, Sharpe, Beall, Fagan, Minnich & McKee

[57] ABSTRACT

A low temperature ion-beam assisted deposition process, comprising the steps of cleaning at least one substrate, subjecting the substrate to a vacuum of at least $2\times10^{-4}$ Torr, heating the substrate to a temperature of at least 280° C., and directing an ion beam at the substrate, wherein the ion beam comprises ion-associated gas molecules of Si or Ge, so as to grow a thin epitaxial film of Si or Ge on the substrate.

20 Claims, 10 Drawing Sheets

FIG. 4a
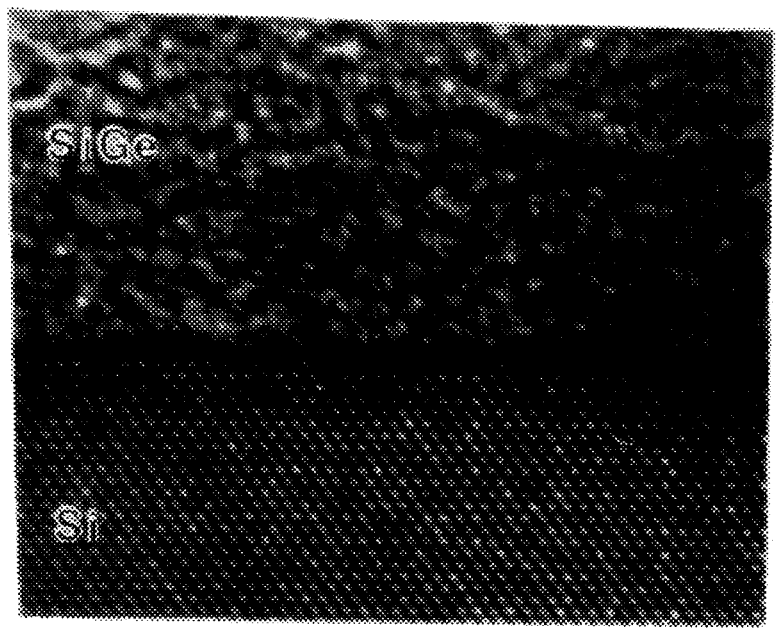
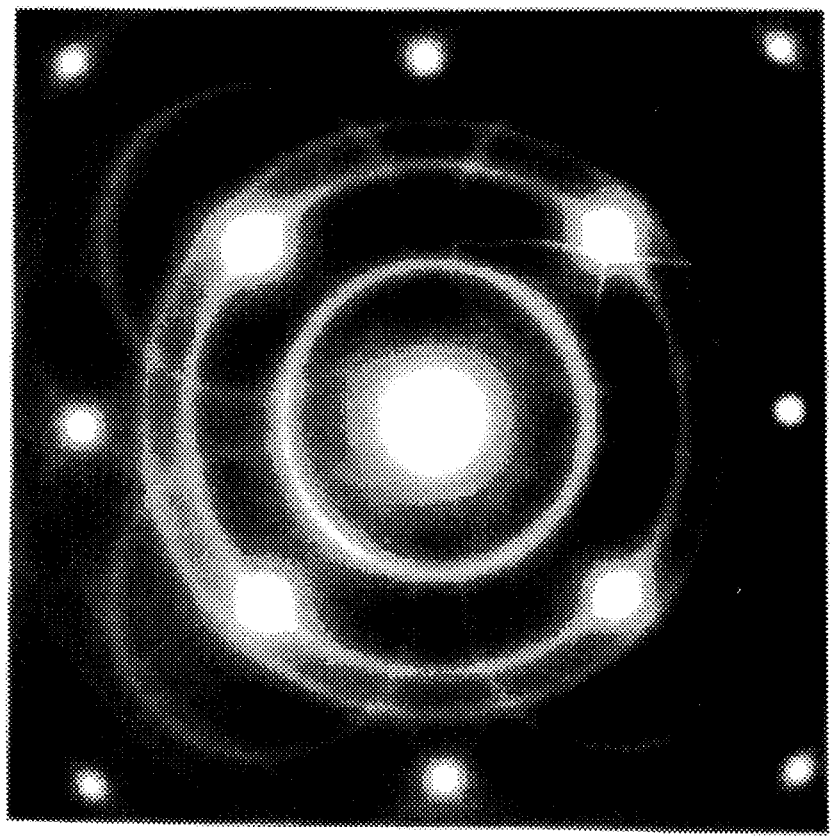
FIG. 4b

ID NO. 5,633,194

LOW TEMPERATURE ION-BEAM ASSISTED DEPOSITION METHODS FOR REALIZING SIGE/SI HETEROSTRUCTURE

FIELD OF THE INVENTION

This invention relates in general to semiconductor fabrication, and more particularly to a low temperature ion beam assisted deposition method for realizing SiGe/Si heterostructures.

BACKGROUND OF THE INVENTION

Ion beam deposition techniques are well known in the field of integrated circuit fabrication. These techniques are of interest because of the capability of ion beam deposition to grow thin film semiconductor layers. The kinetic energy of the ions can enhance the likelihood of epitaxial growth at lower substrate temperatures than are possible with prior art thermal evaporation techniques. Most prior art ion beam deposition techniques utilize sputtering (see T. Ohmi, K. Matsudo, T. Shibata, T. Ichikawa, Appl. Phys. Lett. 53, 364, (1988)). The use of a $Si^+$ beam for direct deposition onto a Si substrate is another alternative which has been utilized for Si epitaxy at low substrate temperatures, as described in K. J. Orrman-Rossiter, A. H. Al-Bayati, D. G. Armour, S. E. Donnely, and J. A. van den Berg, Nucl. Instrum. Methods B 59/60, 197 (1991), and A. H. Al-Bayati, K. J. Boyd, D. Marton, S. S. Todorov, J. W. Rabakais, Z. H. Zhong and W. K. Chu, J. Appl. Phys. 76, 4383 (1994). Plasma enhanced chemical vapor deposition, although mostly a chemical reaction technique, also utilizes energetic reactive ions, neutral excited molecules and radicals to enhance the growth rate of semiconductor films, as described in T. J. Donahue and R. Reif, J. Appl. Phys. 2757 (1985).

All of the prior art MBE and CVD techniques utilize high growth temperatures and expensive equipment.

SUMMARY OF THE INVENTION

According to the present invention, two techniques are provided for utilizing ion beams to realize epitaxial grown films of SiGe, Si or Ge, on Si substrates. The first approach utilizes ion beam assisted deposition (IBAD) in conjunction with thermal co-evaporation of the elemental components. According to this technique, an ion beam is utilized to impart mobility to deposited adatoms. According to the second approach, the ion beam is used to deposit one of the components from ion-dissociation of gas molecules (e.g. Si from $SiH_4$ or Ge from $GeH_4$ ion beams), while the other components are provided by thermal co-evaporation. The processes of the present invention give rise to good quality epitaxial films at low temperatures (e.g. in the range of 250°–350° C.).

The most important advantage of the methods according to the present invention over the prior art are that the films are processed entirely at low temperatures and hence can be used for post-IC modifications (e.g. to add additional critical devices to an integrated circuit (IC) chip). The processes of the present invention can be integrated into state of the art IC fabrication sequences to realize various Si devices and SiGe hetero-junction devices. The processes of the present invention avoid the requirement of expensive fabrication equipment.

A broad description of applicant's first process is provided in applicant's publication entitled "A Low Temperature Ion-Beam Assisted Deposition Method for Realizing SiGe/ Si Heterostructures", Solid State Electronics, Volume 37, No. 8, pages 1467–1469, August 1994.

BRIEF DESCRIPTION OF THE DRAWINGS

A detailed description of the invention and its preferred embodiment is provided below with reference to the following drawings, in which:

FIG. 4(a) is a high resolution image of the SiGe-Si interfacial region displaying the micro-crystalline nature of the SiGe growth layer discussed above in connection with FIGS. 1–3.

FIG. 4(b) shows the <001> zone axis selected area selectron diffraction pattern.

FIG. 11 is a cross sectional transmission electron microscopy (TEM), in which

DETAILED DESCRIPTION OF THE PREFERRED EMBODIMENT

Figure 1:
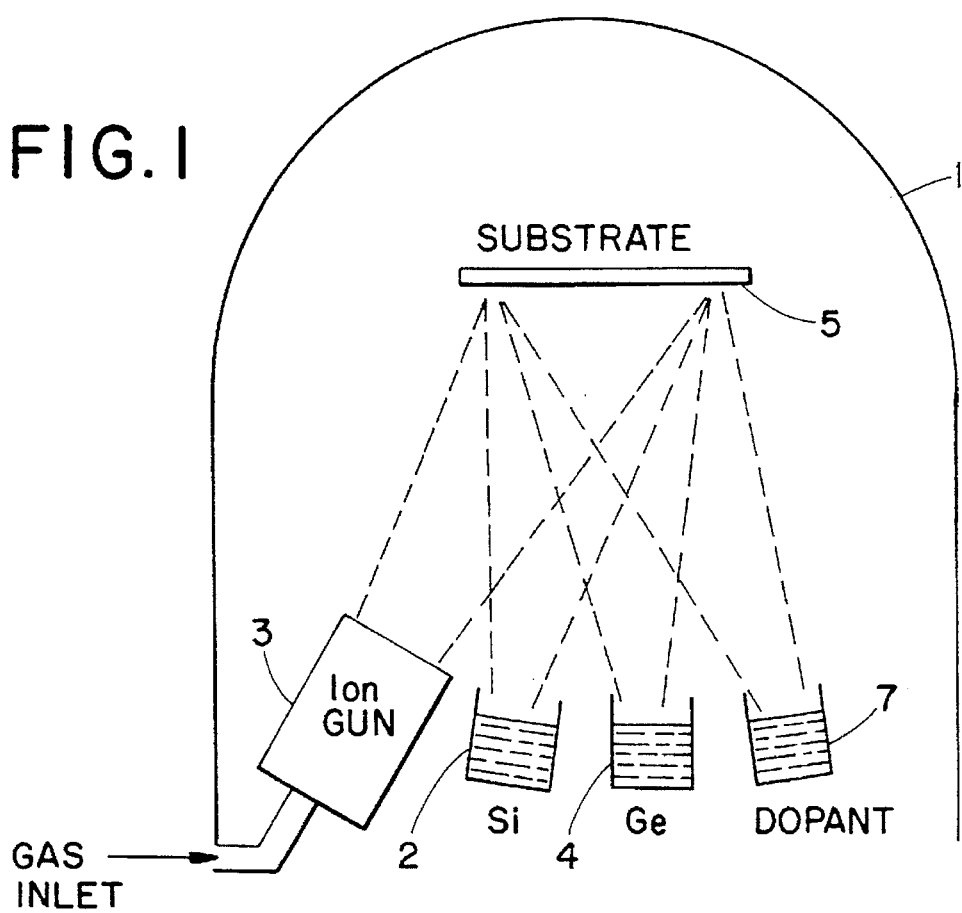
FIG. 1 is a schematic diagram of a vacuum deposition chamber for implementing a first process in accordance with the present invention.

Turning to FIG. 1, an experimental set-up is shown for implementing the first process in accordance with the present invention.

A 45 cm diameter glass cylinder vacuum chamber 1 is evacuated using a mechanical pump backing a diffusion pump (not shown). A liquid nitrogen cold trap (not shown) is used to reduce the level of water vapor during the film deposition. A base pressure of 1×10⁻⁷ Torr (1.3×10⁻⁵ Pa) is maintained. Silicon 2 and germanium 4 are evaporated using an electron gun 3 and an indirectly heated AlO₂ crucible 5 source, respectively. A commercial Kaufman type IonTek ion gun 3 is used to bombard the surface of a substrate 5 during film deposition. Ultra high pure (UHP grade) argon is used as the source gas for the ion beam. The ion beam is directed towards the substrate 5 at an angle of 20° with respect to the normal to the sample surface.

According to actual experiment, <100>, 1 Ωcm n-type silicon wafers were used as the substrate 5. The back of the substrate was doped with phosporous to enhance its backside ohmic contact. The substrate 5 was cleaned using standard RCA solution and given an HF dip just before loading into the deposition chamber 1. The ion beam energy and current were set to 75 eV and 15 mA, respectively. The substrate temperature during film growth was maintained at 260° C. and was monitored using a thermocouple (not shown) located at the back side of the substrate 5. The deposition rate was monitored using a crystal microbalance positioned close to the substrate 5, and an average growth rate of 5 nm per minute was measured, resulting in a n-type doping of 2×10¹⁹ cm⁻³. Phosphorus co-evaporation was carried out in-situ from source 7 to dope the deposited SiGe film. Since the deposition was carried out at a low substrate temperature, the sticking coefficient of the phosphorus was close to unity.

Figure 2:
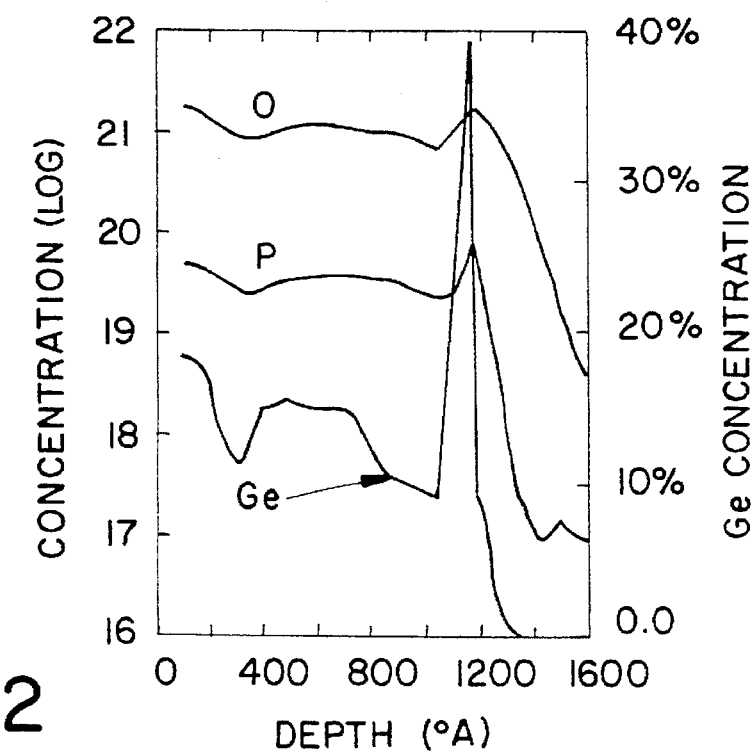
FIG. 2 is a SIMS profile of a prepared SiGe film on a Si substrate using the process discussed in connection with FIG. 1.

FIG. 2 shows the SIMS profile for the SiGe/Si sample product in accordance with the above-described process. In this Figure, Ge is plotted on a linear scale which shows a sharp step in its profile at the interface. FIG. 2 shows the creation of a SiGe film with a varying Ge concentration. Based on the SIMS results, a 40% Ge concentration is observed close to the Si-Ge interface and it sharply drops to an average of 15% in the rest of the film. The sharp increase in the Ge concentration is as a result of inadequate control at the beginning of the evaporation.

The SIMS results also show that there is a high level of oxygen incorporated into the SiGe film with concentrations in the order of 1×10²¹cm⁻². This high oxygen content is believed to be due mainly to the low vacuum condition and high partial pressure of water vapor during film deposition.

In order to investigate the nature of the films, Rutherford back scattering (RBS) and Cross-sectional TEM were employed. The sample was annealed at an ambient temperature of 800° C. for 30 seconds using a rapid thermal processing system (RTP).

Figure 3:
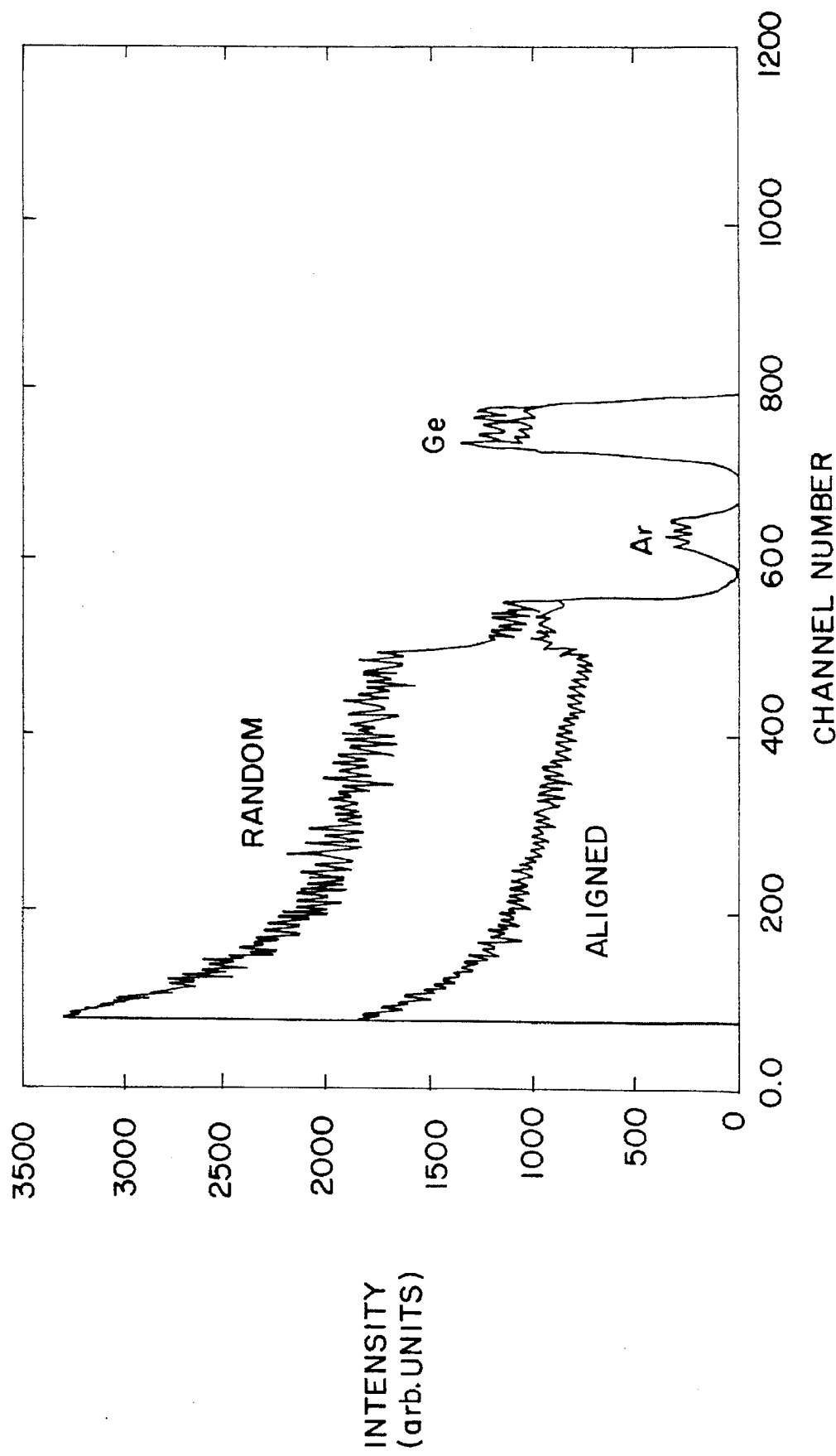
FIG. 3 is a Rutherford back scattering spectra for the SiGe film on Si substrate discussed in connection with FIG. 2.

FIG. 3 shows the RBS spectra for the annealed sample. The random spectrum in this figure corroborates the presence of a SiGe film on the Si substrate with an average Ge concentration of 15%. The Ge fraction inferred from RBS is seen to substantially agree with the SIMS profile of FIG. 2. In addition to germanium, RBS also shows evidence for the incorporation of argon and its concentration is more than 5%. the ionization efficiency limit of the ion gun 3 used in this experiment is believed to be responsible for this high concentration of Ar in the SiGe film. The ion beam generated using this type of ion-gun, consists of both ionized and non-ionized Ar atoms. The non-ionized portion of the Ar flow is not characterized by substantial kinetic energy (except for kinetic energy imparted by thermal energy) and when the Ar flow collides with the substrate 5, a portion of the non-ionized Ar atoms is buried in the growing film without any means to escape. It is known that Ar incorporation should be kept below 0.2% in order to facilitate crystal regrowth, since the presence of high percentages of Ar can affect the crystallinity of the SiGe layer and impact device electrical characteristics.

Another peak in the RBS is observed in the random spectrum of FIG. 3 which is believed to be due to tungsten (W). The incorporation of this element is believed to originate from the sublimation of the hot cathode filament used inside the ion gun 3. The concentration of this element in the film is about 0.1%. the channelled spectrum in FIG. 3 shows a yield of 15–20% less than the random spectrum indicating a partial alignment in the film crystal structure. This partial alignment in the film can be due to the micro-crystal structure of the SiGe layer.

The structure of the SiGe-Si interface was studied using transmission electron microscopy (TEM). TEM samples in (110) cross-section were prepared by a cleavage technique, as set forth in J. McCaffery, "Small-angle Cleavage of Semiconductors for Transmission Electron Microscopy", Ultramicroscopy, vol. 38, pp. 149–157, 1991. Plan view samples were prepared using standard ion milling techniques. All microscopy was performed using a Philips CM20 TEM operated at 200 kV.

FIG. 4(a) shows a high resolution image of the annealed SiGe-Si interfracial region with the substrate 5 in a [110] zone axis orientation. The SiGe film is micro-crystalline and contrast due to the <111> fringes of individual crystals is clearly observable. Applying dark field diffraction contrast techniques, the sizes of the crystallites composing the micro-crystalline layer were found to range from 5 to 9 nm. FIG. 4(b) is a <001> selected area diffraction pattern obtained from a plan view of the specimen. The individual spots are due to the Si substrate 5. Sharp rings around each of the spots are produced by the SiGe film and give further evidence to the micro-crystalline nature of the SiGe layer.

Figure 5A:
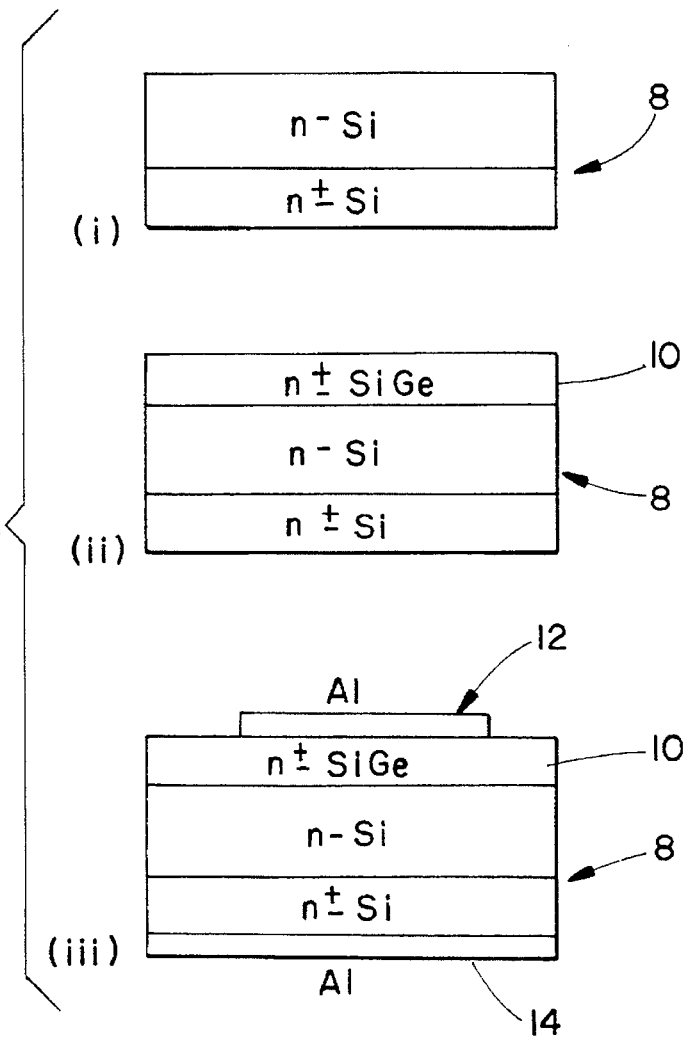
FIG. 5(a) is a schematic diagram showing the steps in fabrication of an SiGe-Si iso-type diode using the first process in accordance with the present invention.

SiGe/Si iso-type diodes were fabricated using ion-beam assisted deposition according to the process described above, at a temperature of approximately 250° C. Starting with an n on n+ silicon wafer 8 (FIG. 5(a) (i)), a phosphorus doped SiGe film 10 was deposited (FIG. 5(a)(ii)) followed by a deposition of aluminum contacts 12 on the film using a shadow masking technique. The aluminum deposition 14 on the back side completed the iso-type diode fabrication (FIG. 5(a)(iii).

The completed diodes were annealed in Forming gas at 250° C. for 20 mins. The diode area in this experiment was 1.5×10⁻² cm⁻². Some randomly selected diodes were chosen to be installed in a low temperature microprobe to study the device characteristics at different ambient temperatures. The current-voltage characteristics of the diodes were measured using a HP-4145B parameter analyzer.

Figure 5B:
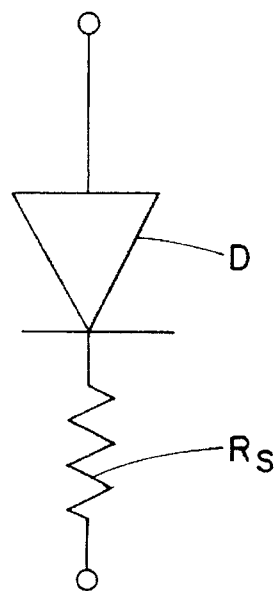
FIG. 5(b) depicts the electrical equivalent circuit for the diode of FIG. 5(a), wherein $R_s$ results primarily from both ohmic resistance and contact resistance.

FIG. 5(b) shows a simple electrical equivalent circuit model for the iso-type diodes fabricated as described above. Since the saturation current in such diodes is fairly high, the influence of the series resistance $R_s$ is significant. Considering the current-voltage relation for a typical diode, the effect of series resistance $R_s$ on the diode characteristics can be determined. Part of the applied voltage on the diode (D), drops across this resistor ($R_o$), reducing the voltage appearing across the intrinsic junction to Vd as in:

$$I = I_o \left( \exp\left( \frac{qV_d}{KT} \right) - 1 \right) \text{ where } V_{tot} = V_d + R_o \times I \quad (1)$$

where I and $V_d$ are the diode current and voltage, respectively. $I_o$ is the diode reverse saturation current, $V_{tot}$ is the total voltage applied across the diode and $R_s$ is the resistance in series with the junction. The series resistance is in part due to the bulk resistance of the substrate 8 and in part due to the contact resistance of the metallization 12 and 14. By lowering the temperature, the deleterious effects of the series resistance can be made less dominant.

Figure 6:
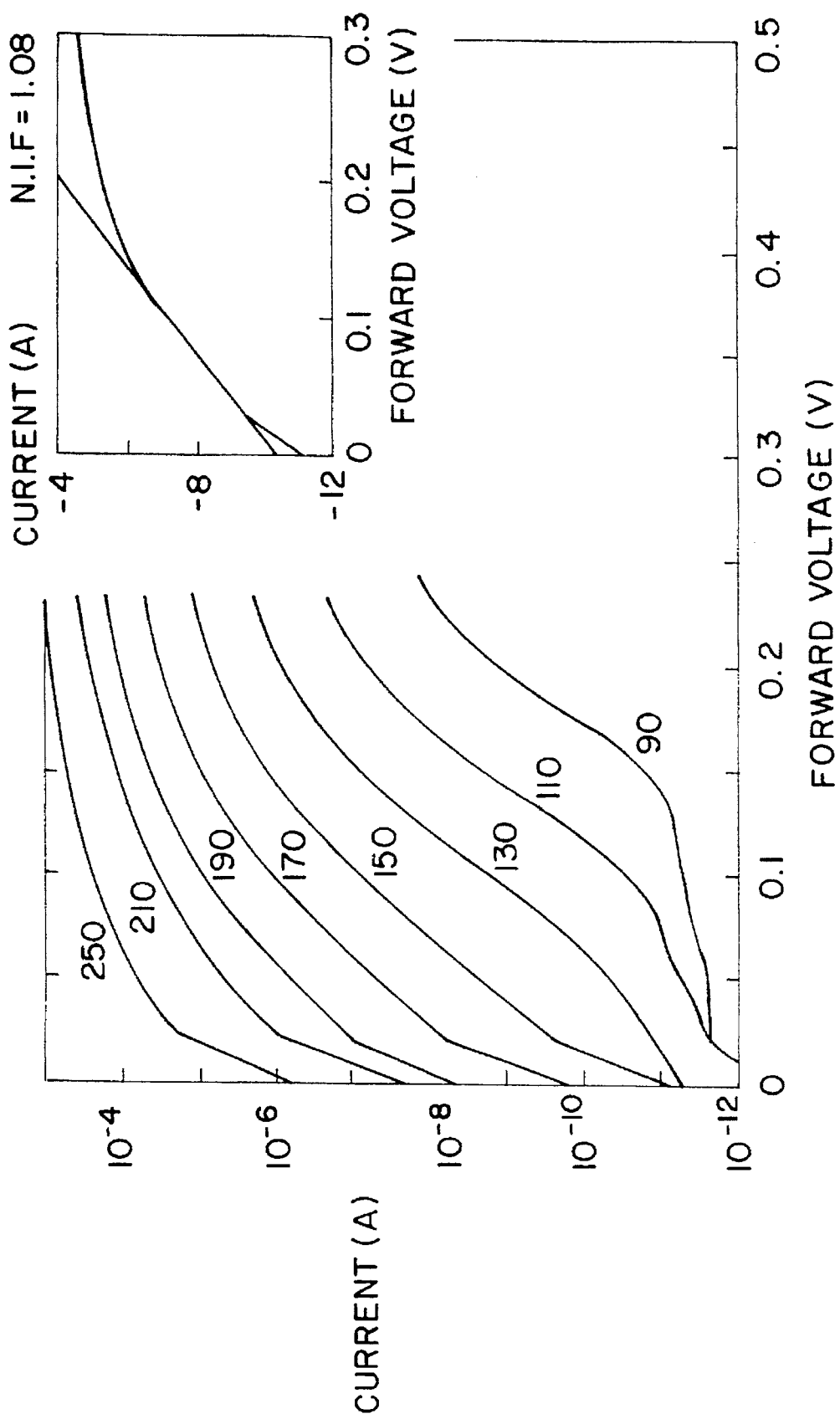
FIG. 6 shows the current-voltage characteristics of the SiGe-Si iso-type diode of FIGS. 5(a) and 5(b) at different ambient temperatures. The inset shows the characteristics at a temperature of 150° K. with an "ideality" factor of 1.08.

FIG. 6 shows the current-voltage characteristics of the iso-type diode of FIG. 5 measured at different ambient temperatures. At temperatures below 170K, an ideal exponential regime becomes apparent. The inset in FIG. 6 shows the I-V characteristic for an iso-type diode at a temperature of 150K with an ideality factor of 1.08 persisting over three decades of current and beyond this it is limited by the series resistance. The behaviour of the diode remains ideal for temperatures as low as the liquid nitrogen temperature where it is limited by the resolution capabilities of the parameter analyzer and level of noise.

Figure 7:
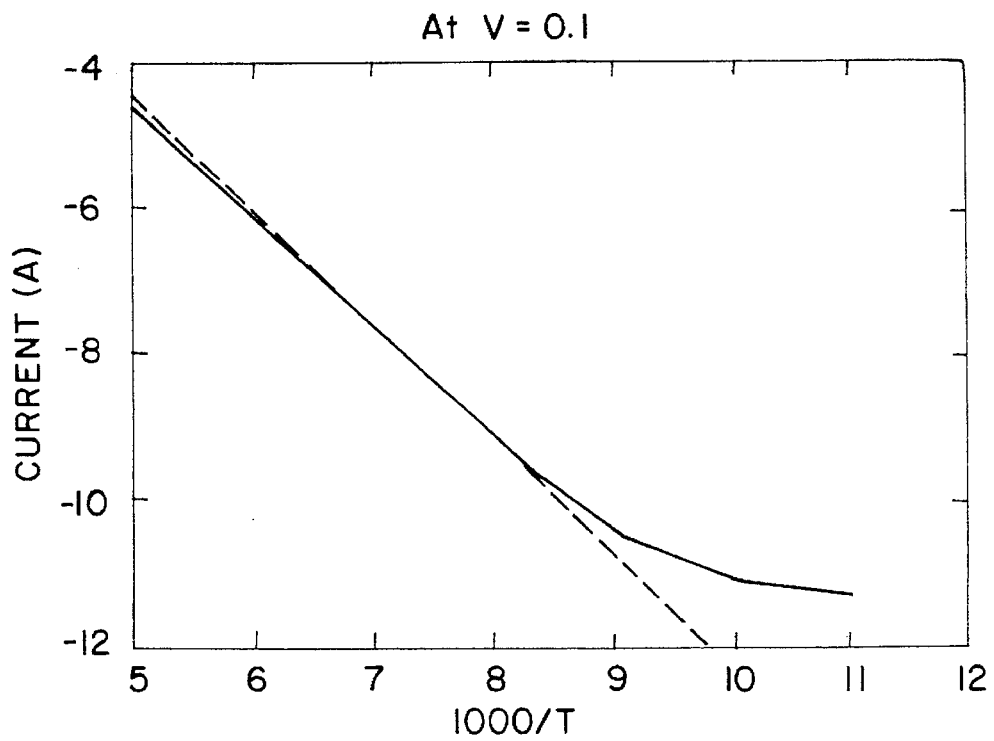
FIG. 7 shows an Arrhenius plot of the SiGe Si iso-type diode of FIGS. 5(a) and (b). The dotted straight line superimposed on the plot indicates an energy barrier height of 0.38 eV for the majority carriers (i.e. electrons).

Both reverse saturation current as well as the forward current strongly depend on the ambient temperature. FIG. 7 shows the Arrhenius plot for the diode at an applied forward voltage of 0.1 V. The exponential decrease of the current with temperature suggests that there is a barrier at the film-substrate interface which blocks the flow of majority carriers (electrons). This barrier can be modeled as:

$$I_o \propto \exp\left(-\frac{E_b}{KT}\right) \quad (2)$$

where $I_c$ shows the reverse saturation current and $E_b$ represents the energy barrier for majority carriers.

Considering Eqn. (1) and ignoring the effect of the series resistance, the forward current at a voltage of 0.1 V can be obtained from:

$$I = I_o \exp\left(-\frac{0.1q}{KT}\right) \rightarrow I \propto \exp\left(-\frac{E_b - 0.1q}{KT}\right) \quad (3)$$

The straight line superimposed on the experimental results of FIG. 7 shows the phenomenological current-temperature characteristics predicted by Eqn. (3) and based on this a barrier height of 0.38 eV is obtained. For temperatures below 130K, the measured current is more than that predicted by Eqn. (3), but at this point the resolution of the parameter analyzer becomes crucial since it cannot measure currents below $10^{-11}$ A.

the formation of such a barrier can be due to the presence of interface states at the SiGe-Si interface, similar to Schottky barrier formation. These states are mostly generated by the dangling bonds of the substrate Si atoms. The presence of such a barrier is not seen for the epitaxially grown SiGe films on Si substrate.

Figure 8:
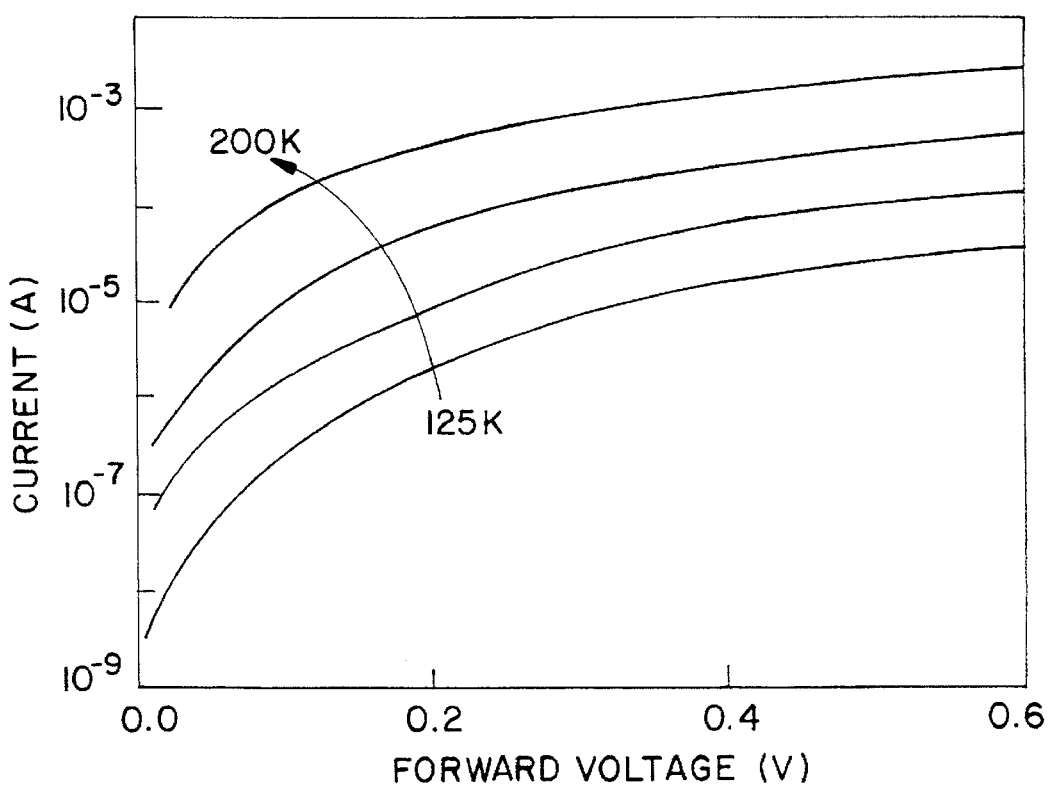
FIG. 8 shows a severe degradation of current-voltage characteristics of the iso-type diodes of FIGS. 5(a) and (b) after rapid thermal annealing at 800° C. for 30 seconds.

FIG. 8 shows the current-voltage characteristics for this sample after rapid thermal annealing at 800° C. for 30 seconds. Although the thermal treatment time was short, it is seen to significantly degrade the I-V results. This extensive degradation of the diode behaviour can be accounted for by the activation of defects at the interface. As indicated by the I-V characteristics, the behaviour remains extremely non-ideal at all ambient temperatures.

To summarize, the static electrical characteristics show good rectifying behaviour of the fabricated n+SiGe/n-Si iso-type hetero-junction diodes with an ideality factor close to unity. At room temperature the reverse saturation current is large and the I-V characteristic is mainly limited by the series resistance. At lower temperatures, it has been shown that the saturation current drops expoentially and the shadowing effect of the series resistance is minimized and the I-V characteristic of the diode exhibits a clear exponential regime. For a wide range of ambient temperatures (90° K.–180° K.), the diode exhibits exponential I-V characteristic with an ideality factor close to unity over three decades of current.

Based on the temperature dependent electrical characteristics of this device and using a simple energy barrier model, it was found that an energy barrier of 0.38 eV appears to fit the observed characteristic as:

$$I = I_o \left(\exp\left(\frac{qV}{KT}\right) - 1\right) \text{ where } I_o \propto \exp\left(\frac{-E_b}{KT}\right) \quad (4)$$

where $E_b$ denotes the energy barrier at the SiGe-Si junction.

Although the SiGe-Si interface states can be responsible for the formation of such an energy barrier, they do not seem to degrade the I-V characteristics of the diode by causing generation or recombination currents that would affect the ideality factor.

High temperature annealing of the film drastically degrades the electrical characteristics as seen by the I-V characteristics at all temperatures investigated. This non-ideal I-V behaviour is believed to be mainly due to the formation of recombination (or generation) centers at the interface.

According to the second process of the present invention, an inexpensive ion beam vapor deposition technique is provided to grow thin semiconductor films derived from ion-dissociation of the semiconductor from gas molecules. According to experiment, silicon films were grown at different substrate temperatures and their atomic structures studied using electron microscopy.

Figure 9:
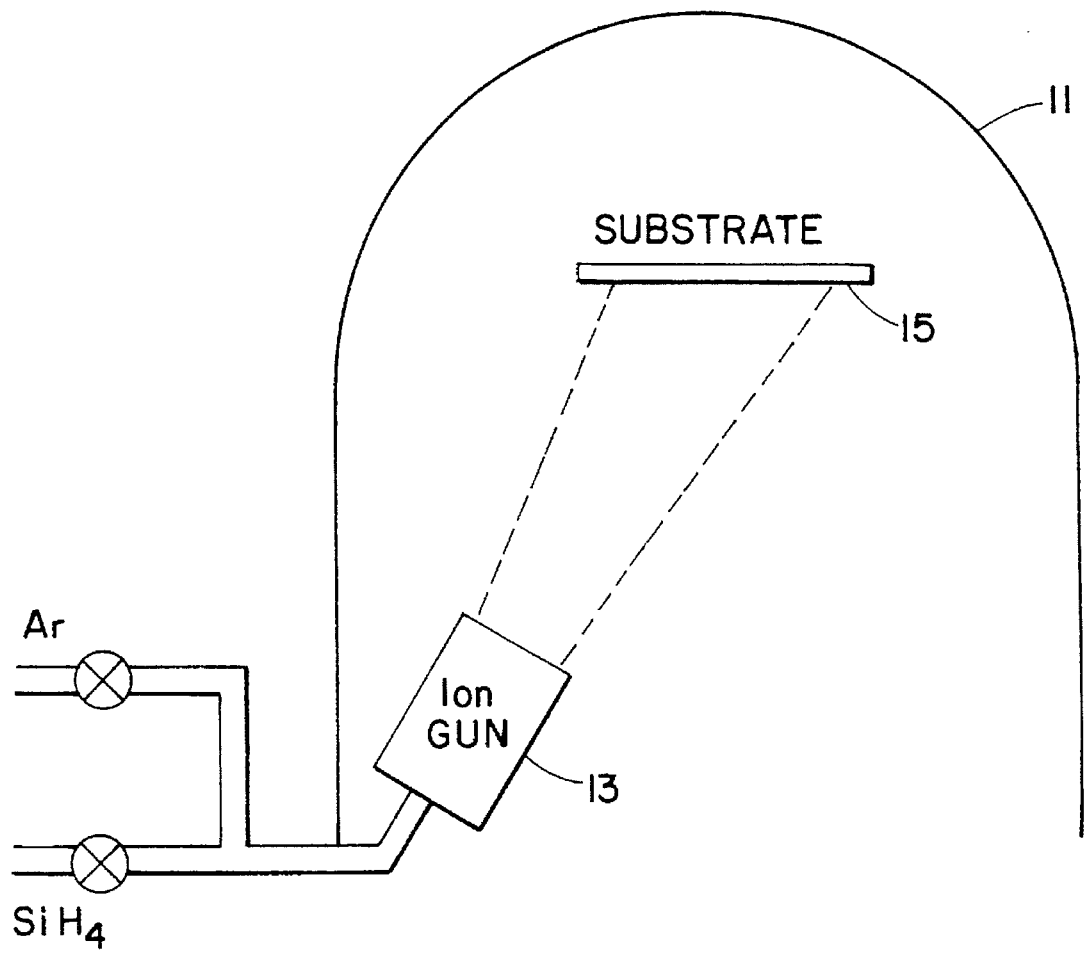
FIG. 9 is a schematic diagram of the deposition chamber utilized in accordance with the second process of the present invention.

The equipment used for this study is illustrated in FIG. 9. A cylindrical vacuum chamber 11 is pumped by a diffusion pump (not shown), equipped with a liquid nitrogen cold trap (not shown) and backed by a rotary mechanical pump (not shown). A base pressure of $1\times10^{-7}$ Torr ($1.3\times10^{-5}$ Pa) is typically attained. A commercially available IonTek Kaufman type ion source 13 was used to ionize the gas and to accelerate the ion beam towards the substrate. The ion gun 13 bombarded the surface of a substrate 15 at an angle of 20° with respect to the normal of its surface. The ion beam energy and current can be adjusted between 30–1000 eV and 0–30 mA, respectively. Ultra high purity argon and silane (SiH$_4$) gasses with 99.999% purity were used as sources for the ion beam. Alternatively, a Ge film can be grown by using GeH$_4$ as the source of gas molecules. For the gun 13 to operate, a chamber pressure of $0.5–2\times10^{-4}$ Torr ($0.65–2.6\times 10^{-2}$ Pa) is required.

For testing purposes, 1Ω-cm n-type <100> Si substrates 15 were used. Each Si substrate was cleaned for 15 mins. in a standard RCA solution. Before loading the Si wafer into the chamber, it was etched in HF followed by a rinse with D.I. water and a N2 blow-dry. After loading the sample and pump-down cycle, the sample was heated to 300° C.

In-situ cleaning of the substrate surface was done by argon ion bombardment prior to the start of deposition. This is a necessary step which significantly influences the quality of the grown film. A 200 eV argon ion beam was used to sputter-clean the substrate at a low substrate temperature ($\approx$50° C.). This low energy ion cleaning was found to be sufficient to remove the native oxide.

After 5 mins. of Ar ion bombardment, the Ar line was closed and the ion gun 13 was shut down. The substrate temperature was set by radiation heating from a tungsten filament (not shown) mounted in a stainless steel box. The substrate temperature was raised to a temperature in the range of 700° C. to 800° C. in about one minute, and held at that temperature from 30 seconds to 1 min., to anneal surface damage caused by the energetic ion bombardment.

The high temperature annealing step before deposition can be eliminated if a proper Ar$^+$-ion beam energy is used. This energy must be low to avoid damaging the substrate, yet it must be strong enough to remove a few monolayers of the native oxide or adsorbed molecules on the substrate surface. It has been found that an ion beam energy of 40 eV at a substrate temperature of 340° C. is sufficient to remove the few monolayers of oxide and absorbed molecules on the substrate without introducing significant damage.

The substrate temperature was then lowered to its desired value (300°–700° C.) to start the deposition. However, planar growth of Si and SiGe films can be achieved at temperatures as low as 250° C. $SiH_4$ gas was introduced to the ion source 13 and the deposition took place at a chamber pressure of $8 \times 10^{-5}$ Torr (although deposition can be carried out a pressures as low as $5 \times 10^{-4}$ Torr.) During the film growth, an ion beam energy of 50 eV and a current of 13 mA were used. The ion beam intensity at the substrate surface was 30 $\mu A$ $cm^{-2}$ and it was measured by a Faraday cup. Following the deposition cycle, the substrate temperature was allowed to cool down. It was observed that at this pressure ($8 \times 10^{-5}$ Torr), no deposition occurred on the parts of the substrate 15 which were not directly exposed to the ion gun.

Figure 10A:
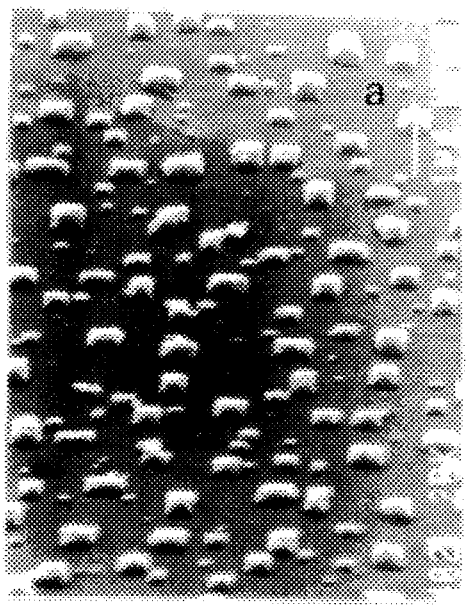
FIG. 10(a) is a scanning electron micrograph for a sample prepared at 700° C. substrate temperature.

The as-grown samples produced by the above described process were used for an electron microscopy study. FIG. 10a shows a scanning electron microscopy (SEM) image of a sample grown at 700° C. Rectangle-based pyramids as large as 1 $\mu m$ in length and 0.3 $\mu m$ in height, oriented with the (100) directions parallel to the substrate, are observed. The micrograph also indicates that many of the pyramids have elongated rectangular bases which are believed to be due to preferential growth influenced by the direction of the incident ion beam.

Figure 10B:
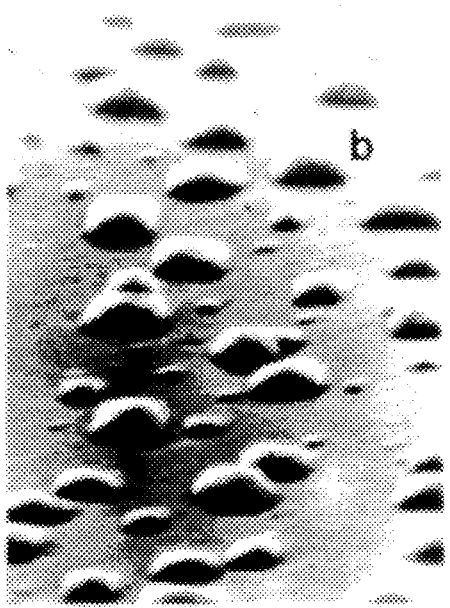
FIG. 10(b) is a scanning electron micrograph of the sample in FIG. 10(a) tilted at 65°.

FIG. 10(b) displays the tilted image for the same sample. As shown in this figure, the surface is covered by pyramids with (111) and (113) faces exposed.

Figure 10C:
FIG. 10(c) shows a sample prepared at 500° C.
Figure 10D:
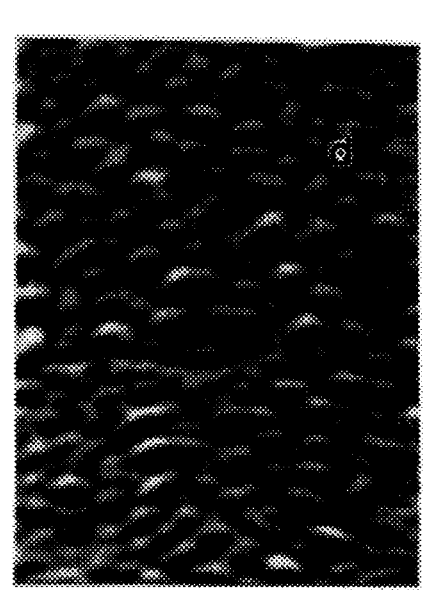
FIG. 10(d) shows the sample of FIG. 10(c) tilted at 65° C.

FIG. 10(c) shows a micrograph of the sample grown at 500° C. evidencing 3-D growth. It appears that the substrate surface is more completely covered at this lower temperature. Although it is difficult to determine the exact thickness of these three-dimensional films, it is evident that at lower temperatures the pyramid heights are less and their distribution is more uniform. Since the kinetic energy of the ion beam is required to dissociate the SiH4 molecules, the total number of Si atoms deposited on the substrate is independent of the substrate temperature. At an ion beam energy of 50 eV, the thermal energy of molecules (kT) is about three orders of magnitude smaller than the ion kinetic energy.

FIG. 19(d) shows a higher magnification SEM image for the same sample. The size of the pyramids is also smaller.

The difference in the coverage of the substrate surface is believed to be due to differences in the Si adatom mobilities. Part of the adatom surface mobility derives from thermal energy gained from the substrate and part from the kinetic energy of the ion beam. At higher substrate temperatures the surface mobility of adatoms is high and they can travel further before they bond with the underlayer. This can result in the formation of islands which are elongated in a preferred direction under the influence of the ion beam. By lowering the temperature of the growth, the total surface mobility is reduced and the probability for planar growth is increased.

Figure 11A:
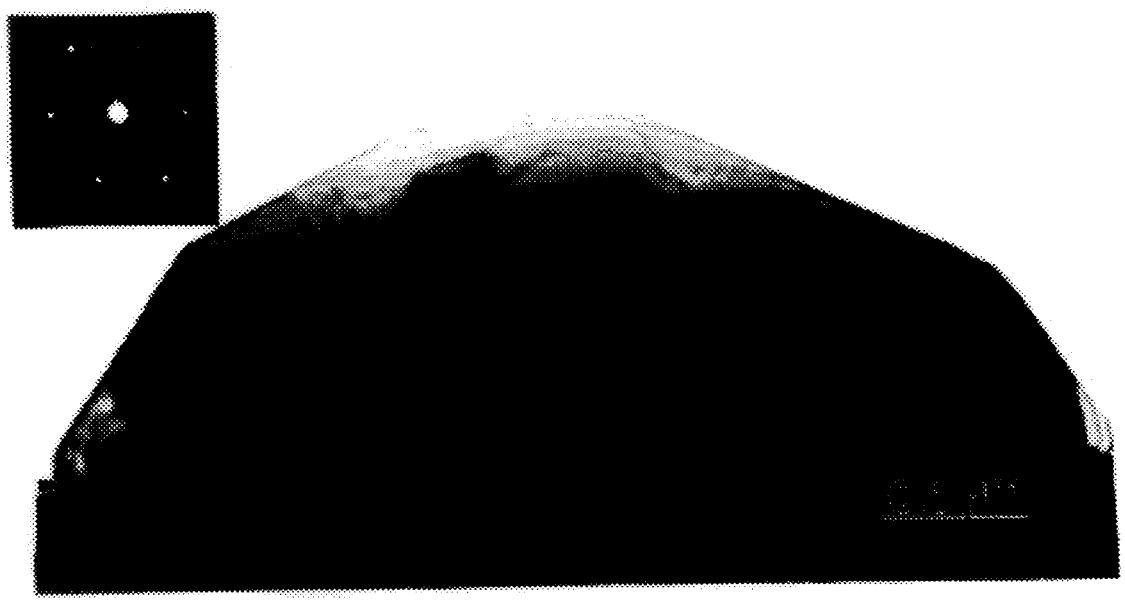
FIG. 11(a) shows a bright field [110] zone axis image of one of a plurality of pyramids grown at 700° C. The insert shows the electron diffraction pattern for the films and the substrate.
Figure 11B:
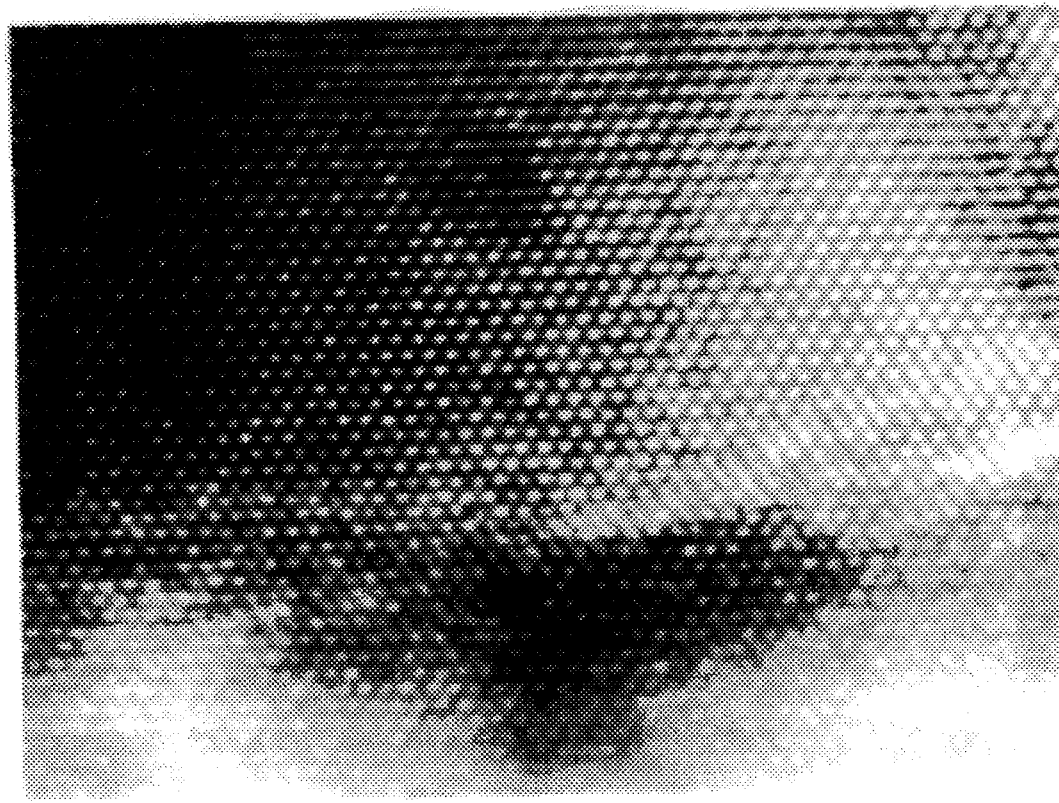
FIG. 11(b) shows a high resolution cross-sectional TEM image for the sample in FIG. 11(a).

To study the crystalline quality of the prepared samples, high resolution transmission electron microscopy (HRTEM) was used. In this study, a small angle cleavage technique was used for the TEM specimen preparations. FIG. 11(a) shows a bright field [110] zone axis image of the sample grown at 700° C. The exposed atomic planes, (111) and (113), are observed in this figure. FIG. 11(b) displays a high resolution cross-sectional TEM image for the film-substrate interface of this sample. Few interfacial defects are observed in this figure indicating a reasonably good quality film. Electron diffraction analysis also indicates that the islands are epitaxially grown.

Figure 12A:
FIG. 12(a) is a bright field image of a sample grown at 300° C.
Figure 12B:
FIG. 12(b) is a high resolution TEM image for the sample in FIG. 12(a) showing epitaxial growth.

The sample prepared using a 700° C. substrate temperature shows a planar growth. FIG. 12(a) displays the bright field [110] zone axis image for this sample indicating planar growth. The bright spots at the film-substrate interface are believed to be due to disordered Si at the interface resulting from the energetic Ar ion bombardment, when there has been insufficient annealing. FIG. 12(b) depicts a high resolution micrograph of the same sample clearly showing the epitaxial growth. The high resolution image also shows the presence of a large concentration of twins and microtwins, originating from the interface. Inadequate in-situ cleaning is believed to be responsible for the observed planar defects. It is contemplated that the damage created due to the 200 eV Ar ion bombardment may be too significant to be adequately repaired by a short annealing time. In comparison with the image in FIG. 11(b), it is seen that the higher temperature growth (700° C.) repairs the damage produced by such energic Ar bombardment.

Al-Bayati et al. have recently studied the effect of substrate temperature on film quality using a mass selected ion beam deposition technique (see ref. K. J. Orrman-Rossiter, A. H. Al-Bayati, D. G. Armour, S. E. Donnely and J. A. van den Berg, Nucl. Instrum. Methods B 59/60, 197 (1991); and A. H. Bayati, K. J. Boyd, D. Marton, S. S. Todorov, J. W. Rabalais, Z. H. Zhang and W. K. Chu, Appl. Phys., 57 2757 (1985)). In their study, substrate temperatures above 350° C. were found to degrade the quality of the Si films, which is a result which seems to corroborate the experimental observations conducted with respect to the present invention.

Ge incorporation into the Si film can be accomplished by thermal evaporation of elemental Ge from a B-N crucible in a manner similar to that discussed above in connection with the first described process (FIGS. 1–8). A portion of the energy of the arriving Si adatoms is imparted to Ge adatoms thereby enhancing their surface mobility and hence the probability of epitaxial growth at reduced temperatures.

In conclusion, a simple and inexpensive technique is provided according to the present invention for growing silicon and silicon-germanium thin films. Depending on the substrate temperature, the films exhibit one of either island or planar growth. With the substrate at a higher temperature, 3-D growth with pronounced pyramids was observed. By lowering the substrate temperature, the probability of achieving planar growth is enhanced. At a substrate temperature of 300° C., planar growth was realized. In-situ cleaning of the sample is an important step of the second described process according to the present invention, and this is achieved by Ar ion bombardment at low temperatures followed by an in-situ annealing.

Results from high resolution transmission electron microscopy, electron diffraction, Raman spectroscopy and scanning electron microscopy confirm the crystalline quality of the films grown by this technique. In addition, electrical characteristics of gallium-doped P-N junction diodes, realized using this approach, show good rectifying behaviour. Specifically, gallium-doped p-n junction diodes have been fabricated according to the process of the present invention by opening windows on an already completed integrated circuit chip having aluminum metallization.

Other embodiments and variations are possible within the sphere and scope of the present invention as defined by the claims appended hereto.

We claim:

1. A low temperature ion-beam deposition process, comprising the steps of:
   a) cleaning at least one substrate;
   b) subjecting said at least one substrate to a vacuum of at least $2\times10^{-4}$ Torr;
   c) heating said at least one substrate to a temperature of 280° C.;
   d) generating an ion beam at an energy of approximately 50 eV and a current of approximately 13 mA; and,
   e) directing an ion beam at an angle of approximately 20° toward said at least one substrate, said ion beam comprising ion-dissociated gas molecules of an element, thereby growing a thin epitaxial film of germanium on said at least one substrate.

2. The process of claim 1, further comprising the steps of thermally co-evaporating a second element on said at least one substrate.

3. The process of claim 2, wherein said at least one substrate comprises Si.

4. The process of claim 3, wherein said element is Si dissociated from $SiH_4$ gas introduced to said ion beam.

5. The process of claim 3, wherein said element is Ge dissociated from $GeH_4$ gas introduced to said ion beam.

6. The process of claim 3, wherein said step of cleaning further comprises immersing said at least one substrate in RCA solution for approximately 15 minutes.

7. The process of claim 6, further comprising the step of in-situ cleaning of said at least one substrate by argon ion bombardment.

8. The process of claim 7, wherein said step of in-situ cleaning is effected utilizing a 200 eV argon ion beam at a temperature of approximately 50° C. for approximately 5 minutes.

9. The process of claim 7 wherein said step of in-situ cleaning is effected utilizing a 40 eV argon ion beam at a temperature of approximately 340°.

10. The process of claim 6, further comprising the step of deglazing said at least one substrate in HF and thereafter rinsing said at least one substrate in D.I. water and blow drying with $N_2$.

11. The process of claim 8, further comprising the step of annealing said at least one substrate for from 30 to 60 seconds at from 700° C. to 800° C. to repair any surface defects caused by said in-situ cleaning.

12. The process of claim 4, wherein said temperature is in the range of 300° C. to 700° C.

13. The process of claim 12, wherein said vacuum is in the range of $5-8\times10^{-5}$ Torr.

14. The process of claim 1, wherein said at least one substrate comprises 1 $\Omega$-cm n-type <100> Si.

15. The process of claim 4, wherein said second element is elemental Ge evaporated from a B-N crucible.

16. A low temperature ion-beam assisted deposition process, comprising the steps of:
   a) cleaning at least one substrate;
   b) subjecting said at least one substrate to a vacuum of approximately $1\times10^{-7}$ Torr;
   c) heating said at least one substrate to a temperature of at least 200° C.;
   d) in-situ ion bombardment of Si on said at least one substrate using Ar source gas for creating an ion beam, said ion beam being directed at an angle of 20° to said at least one substrate, said ion bombardment being carried out at 150–170 eV and at an ion current of 14–16 mA;
   e) evaporating Ge on said at least one substrate simultaneously with said in-situ ion bombardment, thereby creating a SiGe/Si heterostructure; and
   f) co-evaporating a dopant for enhancing conductivity of said SiGe/Si heterostructure.

17. The process of claim 16, wherein said Ge is evaporated from a vitreous carbon crucible.

18. The process of claim 16, wherein said step of cleaning further comprises immersing said at least one substrate in RCS solution for approximately 15 minutes.

19. A low temperature ion-beam assisted deposition process, comprising the steps of:
   a) cleaning at least one substrate;
   b) subjecting said at least one substrate to a vacuum of approximately $1\times10^{-7}$ Torr;
   c) heating said at least one substrate to a temperature of at least 200° C.;
   d) in-situ ion bombardment of Si on said at least one substrate using Ar source gas for creating an ion beam, said ion beam being directed at an angle of 20° to said at least one substrate, said ion bombardment being carried out at approximately 75 eV and an ion current of approximately 15 mA at a temperature of approximately 260° C.;
   e) evaporating Ge on said at leas at one substrate simultaneously with said in-situ ion bombardment, thereby creating a SiGe/Si heterostructure; and
   f) co-evaporating a dopant for enhancing conductivity of said SiGe/Si heterostructure.

20. The process of claim 16, wherein said dopant is phosphorus.

* * * * *